(12) United States Patent
Ju et al.

(10) Patent No.: US 7,125,275 B1
(45) Date of Patent: Oct. 24, 2006

(54) ELECTRICAL CONNECTOR

(75) Inventors: Ted Ju, Keelung (TW); Wen-Chang Chang, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/263,944

(22) Filed: Nov. 2, 2005

(51) Int. Cl.
*H01R 4/50* (2006.01)
*H01R 13/62* (2006.01)

(52) U.S. Cl. ...................... 439/342; 439/331
(58) Field of Classification Search ........... 439/342, 439/259, 260–268, 330–331
See application file for complete search history.

(56) References Cited

U.S. PATENT DOCUMENTS

| | | | |
|---|---|---|---|
| 4,512,621 A * | 4/1985 | Bethurum | 439/395 |
| 4,519,660 A * | 5/1985 | Ichimura et al. | 439/296 |
| 5,454,727 A * | 10/1995 | Hsu | 439/263 |
| 6,247,954 B1 * | 6/2001 | Ju | 439/342 |
| 6,264,490 B1 * | 7/2001 | Lemke et al. | 439/342 |
| 6,699,055 B1 * | 3/2004 | Peng et al. | 439/342 |

* cited by examiner

*Primary Examiner*—Hien Vu
(74) *Attorney, Agent, or Firm*—Troxell Law Office PLLC

(57) ABSTRACT

An electrical connector is disclosed to include an electrically insulative housing, which has relatively higher first stop walls and relatively lower second stop walls each defining with the first stop walls a respective terminal slot, first terminals mounted in the terminal slots and protruding over the first stop walls for the contact of an external electronic device, and second terminals mounted in the terminal slots and movable relative to the first terminals and partially protruding over the second stop walls for the contact of the first terminals upon loading of the external electronic device.

12 Claims, 6 Drawing Sheets

ELECTRICAL CONNECTOR

BACKGROUND OF THE INVENTION

1. Field of the Invention

The present invention relates to electrical connectors and more particularly, to an electrical connector designed for compression contact with a chip module.

2. Description of the Related Art

Currently, some electronic products (such as computers) use a LGA (Land grid array) module for performance enhancement. A LGA module uses laminate substrate to form the landing pad and the exposed pad. A conventional electrical connector for use with a LGA module, as shown in FIGS. 11 and 12, an electrically insulative housing 50, a plurality of terminals 60 respectively mounted in the electrically insulative housing 50, and a plurality of solder balls 70 respectively provided at the bottom side of each of the terminals 60 and soldered to a circuit board (not shown). Each terminal 60 has a top spring arm 602, which has a tip terminating in a contact portion 601. During installation, the chip module (not shown) is pressed on the contact portions 601 of the terminals 60, achieving electric connection with the circuit board. Because the top spring arm 602 and the contact portion 601 protrude over the top side of the electrically insulative housing 50, the terminals 60 bias toward one side and tend to be forced out of place during installation of the chip module. Further, the complicated architecture of the terminals 60 requires much installation space, not suitable for a high density installation. After installation of the terminals 60 in the housing 50, a relatively higher inductance effect tends to be produced between each two adjacent terminals 60, not suitable for the transmission of a high frequency signal.

Therefore, it is desirable to provide an electrical connector that eliminates the aforesaid drawbacks.

SUMMARY OF THE INVENTION

The present invention has been accomplished under the circumstances in view. It is the main object of the present invention to provide an electrical connector, which allows installation of terminals in a high density.

To achieve this and other objects of the present invention, the electrical connector comprises an electrically insulative housing, which has a plurality of terminal slots, a plurality of first stop walls respectively surrounding the terminal slots at one side, and a plurality of second stop walls respectively surrounding the terminal slots at the opposite side corresponding to the first stop walls, the first stop walls being relatively taller than the second stop walls, a plurality of first terminals respectively mounted in the terminal slots and partially extending out of the bottom side of the electrically insulative housing, and a plurality of second terminals respectively mounted in the terminal slots.

The first terminal and the second terminal in each terminal slot are movable relative to each other and adapted to contact each other when the first terminal receives a pressure toward the respective second terminal.

DETAILED DESCRIPTION OF THE PREFERRED EMBODIMENT

Figure 1:
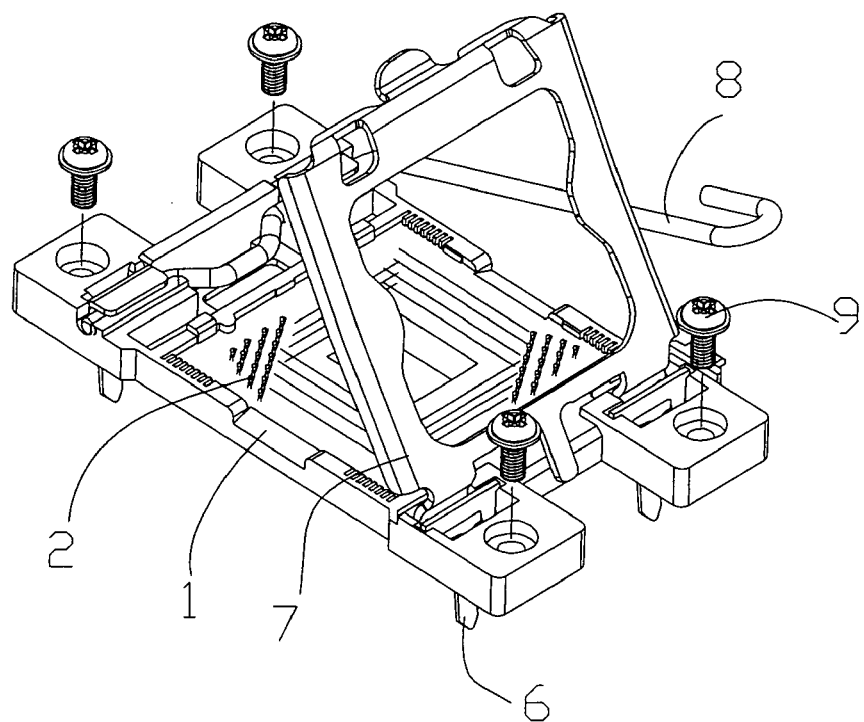
FIG. 1 is a perspective view of an electrical connector according to a first embodiment of the present invention, showing the unlocked status of the holding down cover.
Figure 2:
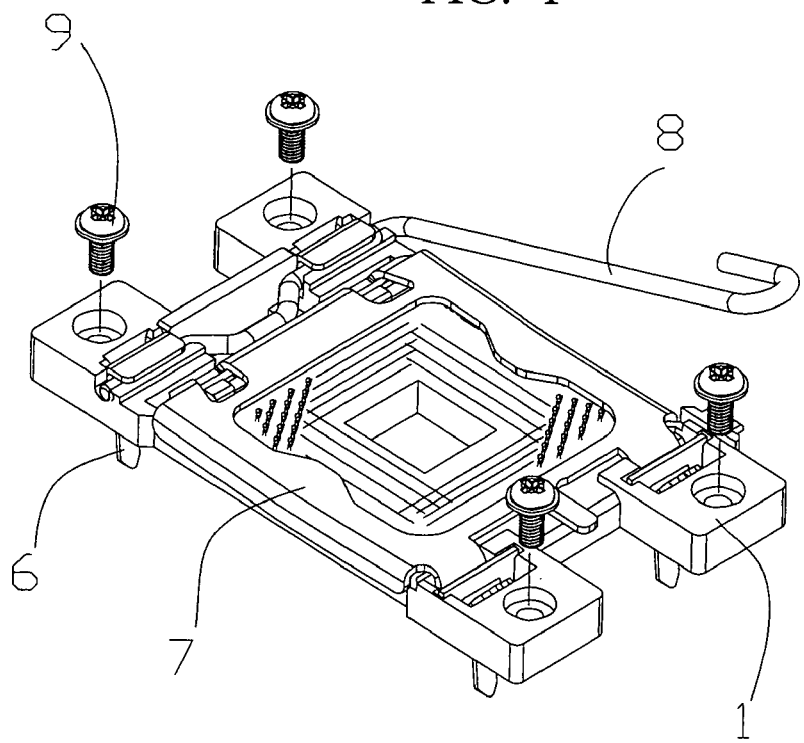
FIG. 2 corresponds to FIG. 1 but showing the holding down cover locked.
Figure 3:
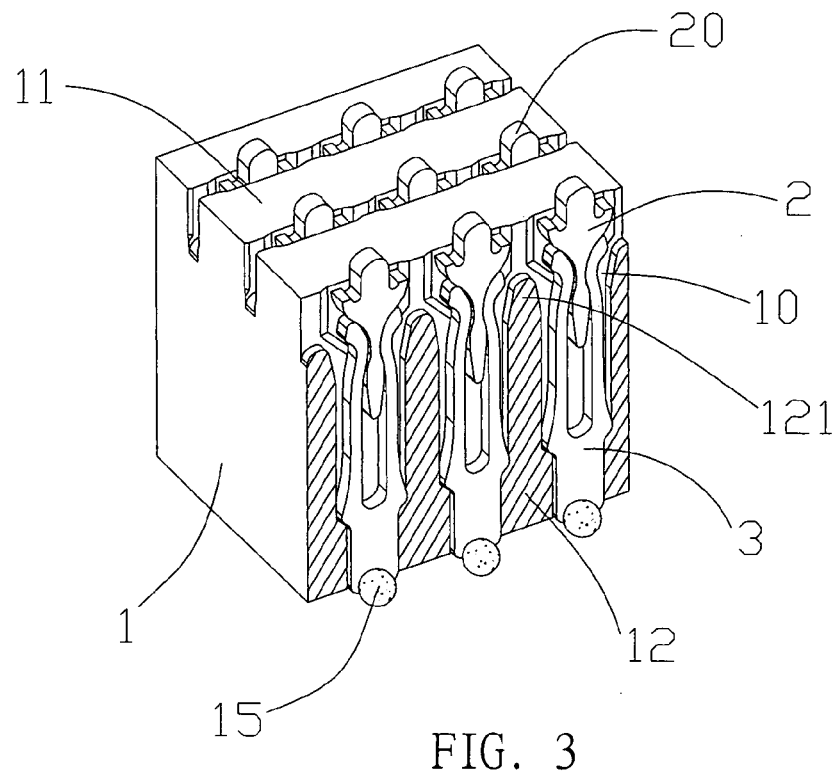
FIG. 3 is a sectional elevation of a part of the electrical connector according to the first embodiment of the present invention, showing the positioning of the first terminals and the second terminals in the respective terminal slots.
Figure 4:
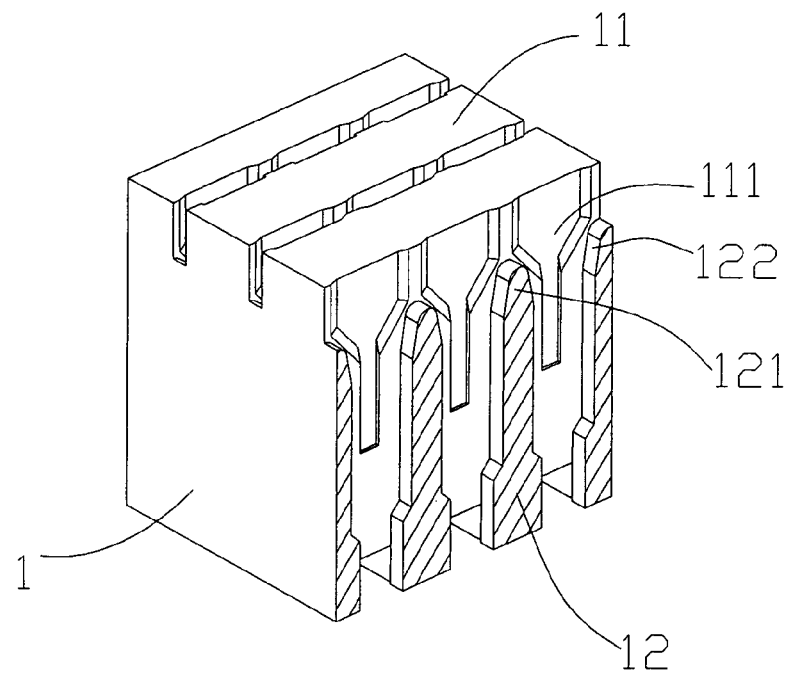
FIG. 4 is a sectional elevation of the electrically insulative housing of the electrical connector according to the first embodiment of the present invention.
Figure 5:
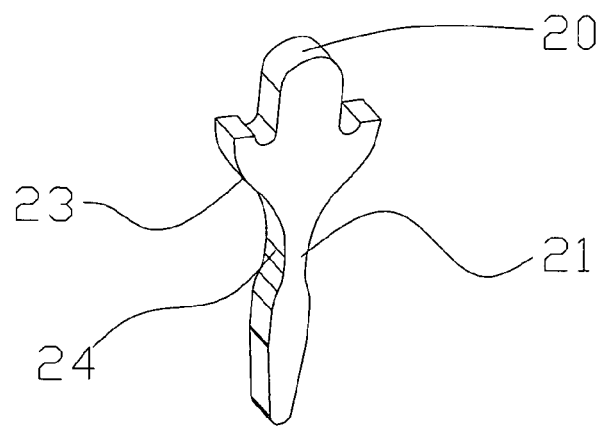
FIG. 5 is an elevational view of the first terminal for the electrical connector according to the first embodiment of the present invention.
Figure 6:
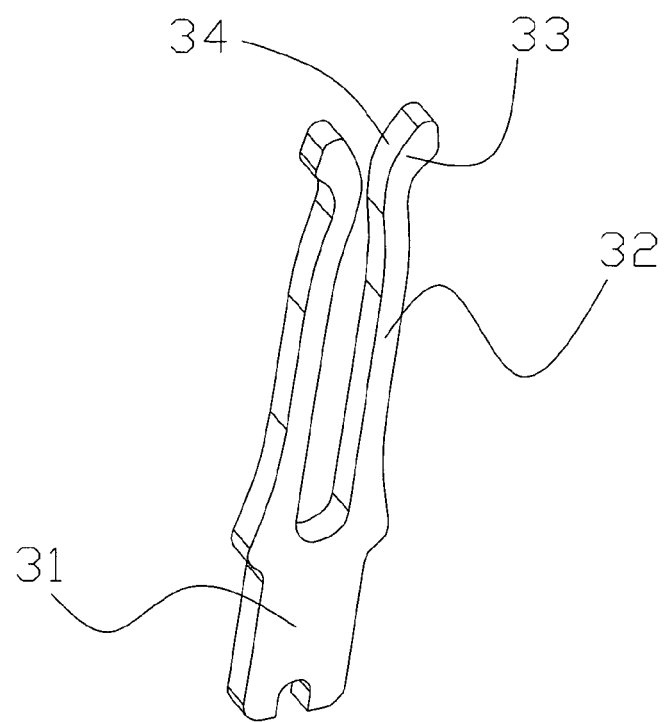
FIG. 6 is an elevational view of the second terminal for the electrical connector according to the first embodiment of the present invention.

Referring to FIGS. 1~8, an electrical connector in accordance with the first embodiment of the present invention is shown comprising an electrically insulative housing 1, terminals, a holding down cover 7 hinged to the housing 1 and adapted to hold down a chip module 4 on the housing 1 in close contact with the terminals, a locking lever 8 pivoted to the housing 1 and adapted to lock the holding down cover 7, and positioning means 6 and fastening means 9 for fixedly securing the electrical connector to a circuit board (not shown). The positioning means 6 can be directly soldered to the circuit board. Further, the terminals include first terminals 2 and second terminals 3.

The housing 1 has a plurality of terminal slots 10, each receiving one first terminal 2 and one second terminal 3. Each first terminal 2 is kept in contact with the respective second terminal 3 in the respective terminal slot 10. A relatively higher first stop wall 11 and a relatively lower second stop wall 12 define each terminal slot 10. The first stop wall 11 has a recessed positioning portion 111 for the positioning of one first terminal 2. The second stop wall 12 has stop portions 121 adapted to limit the limit displacement of the respective second terminal 2, and a beveled edge 122.

The first terminals 2 and the second terminals 3 are flat metal members made of different metal materials having different conductivity. The first terminals 2 are made of pure copper, having a relatively higher conductivity than the second terminals 3, each having a top contact portion 20 that protrudes over the first stop wall 11 for the contact of an external electronic device (according to this embodiment, this external electronic device is the aforesaid chip module 4), a bottom press portion 21 for pressing the respective second terminal 3, two sloping surface portions 23 downwardly inwardly disposed at two opposite lateral sides between the top contact portion 20 and the bottom press portion 21, and two locating grooves 24 symmetrically disposed at the two opposite lateral side walls of the bottom press portion 21. The second terminals 3 are forked metal plate members made of copper alloy for the advantage of high resilient power, each having a bottom bonding portion 31 for bonding to an external electronic device (according to this embodiment, this external electronic device is the aforesaid circuit board) with a solder material (not shown), and two top spring arms 32. The top spring arms 32 each have a bearing portion 33 and a sloping surface portion 34. The bottom press portion 21 of each first terminal 2 is inserted into the gap between the two top spring arms 32 of the respective second terminal 3 and stopped against the topmost edge of the bottom bonding portion 31 of the respective second terminal 3 with the respective slopping surface portions 23 abutted against the respective sloping surface portions 34 of the respective second terminal 3 and the respective locating grooves 24 kept in engagement with the respective bearing portions 33 of the respective second terminals 3.

Figure 7:
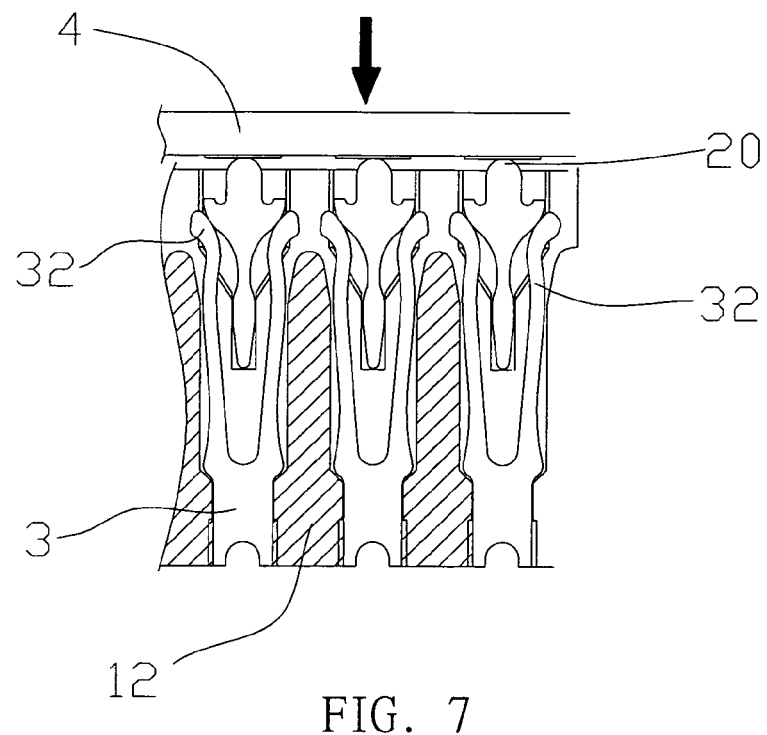
FIG. 7 is a schematic sectional view showing a chip module pressed on the first terminals against the second terminal according to the present invention.
Figure 8:
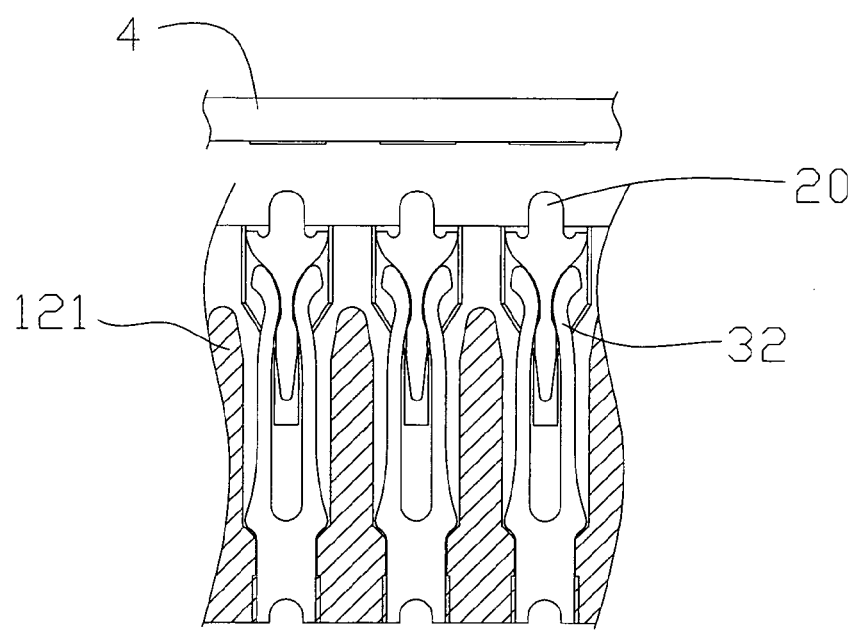
FIG. 8 corresponds to FIG. 7, showing the chip module removed from the first terminals.

Referring to FIGS. 7 and 8, when mounting the chip module 4, the first terminals 2 will be forced downwards by the chip module 4, and the top spring arms 32 of each second terminal 3 will be forced to curve outwards by the sloping surface portions 23 of the respective first terminal 2. At this time, the stop portions 121 of the second stop wall 12 of each terminal slot 10 will limit the deformation of the top spring arms 32 of the respective second terminal 3, and the bearing portions 33 of the top spring arms 32 of each second terminal 3 will be stopped at the top side of the respective second stop wall 12 against the respective first terminal 1, and therefore each first terminal 2 will be kept in positive contact with the respective second terminal 3. After removal of the chip module 4 from the first terminals 2, the top spring arms 32 of the second terminals 3 immediately return to their former shape to push the respective first terminals 2 upwards to their former position. Thus the electrical connector achieves the function of the so-called compression contact type electrical connector.

Further, because the second stop wall 12 is relatively lower than the first stop wall 11, a space is provided above the second stop wall 12 for accommodating the bearing portions 33 of the top spring arms 32 of the respective second terminal 3. Therefore, the invention allows a high density arrangement of the terminals.

Figure 9:
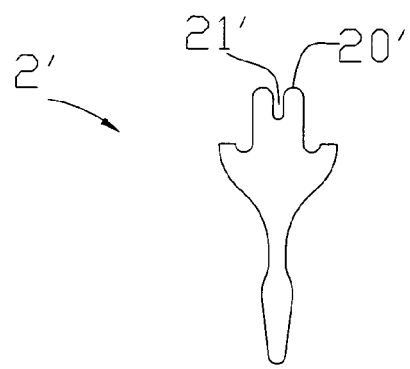
FIG. 9 illustrates a first terminal for electrical connector according to a second embodiment of the present invention.

FIG. 9 shows a first terminal 2' constructed according to the second embodiment of the present invention. According to this embodiment, the top contact portions 20' of the first terminal 2' is notched, thereby forming two contacts.

Figure 10:
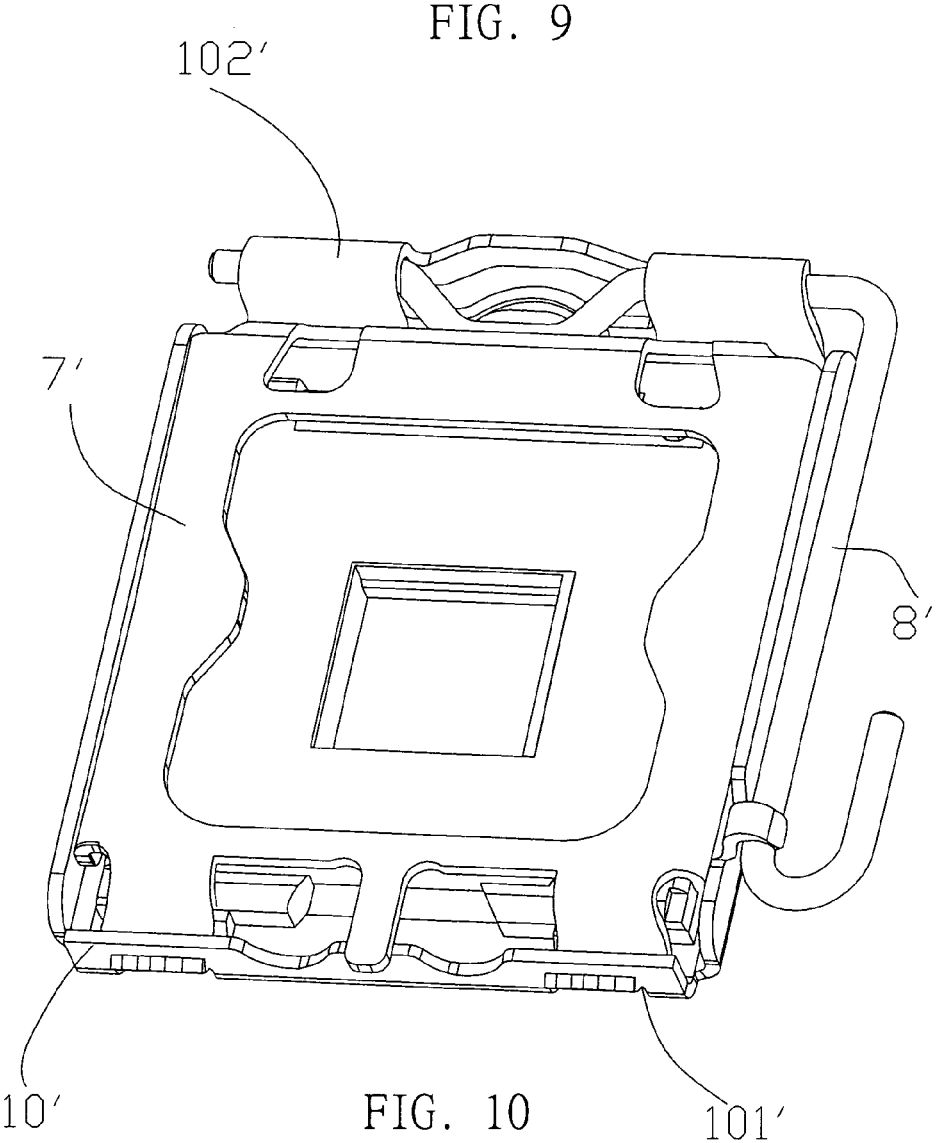
FIG. 10 is a perspective view of an electrical connector according to a third embodiment of the present invention.
Figure 11:
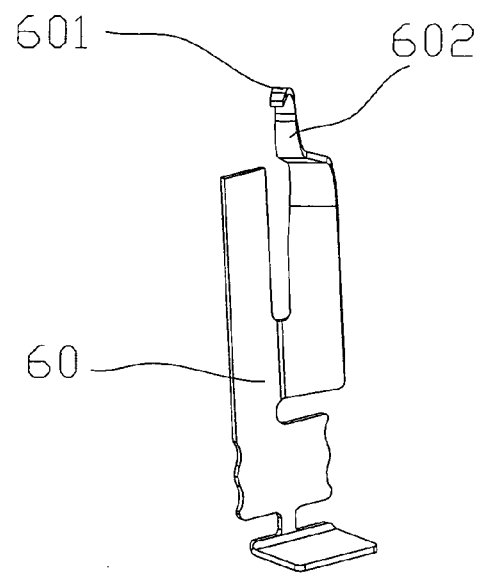
FIG. 11 is an elevational view of a terminal for an electrical connector according to the prior art.
Figure 12:
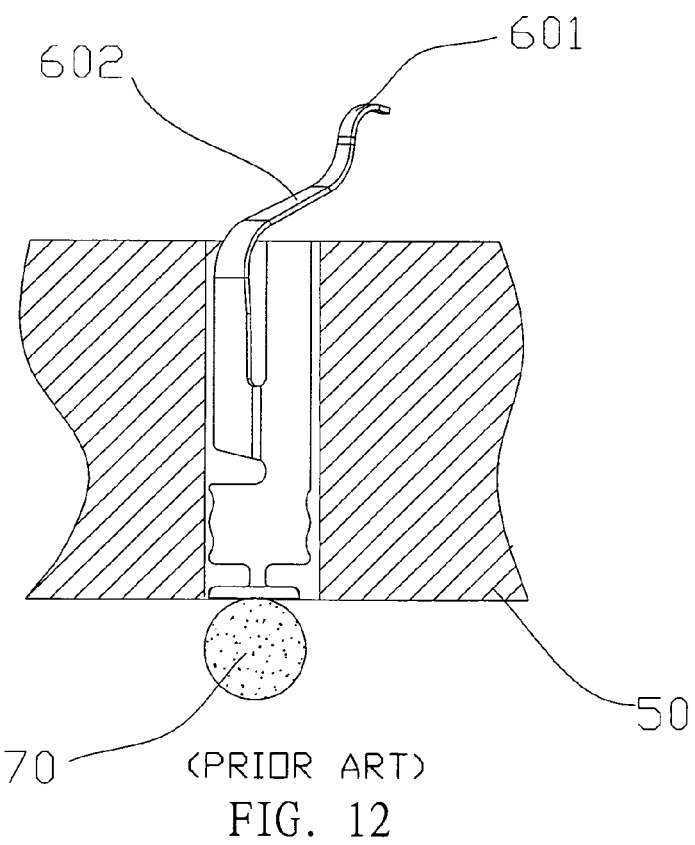
FIG. 12 is a sectional view of the prior art electrical connector.

FIG. 10 is a schematic drawing of an electrical connector according to the third embodiment of the present invention. According to this embodiment, the electrical connector comprises a metal holder frame 10' holding the electrically insulative housing (no shown); the holding down cover 7' is pivotally fastened to the pivot holes 101' at one side of the metal holder frame 10'; the locking lever 8' is pivotally fastened to knuckles 102' at the opposite side of the metal holder frame 10'. This embodiment achieves the same effect.

Although particular embodiments of the invention have been described in detail for purposes of illustration, various modifications and enhancements may be made without departing from the spirit and scope of the invention.

What the invention claimed is:

1. An electrical connector comprising:
   an electrically insulative housing, said electrically insulative housing having a cover, a lever, a plurality of terminal slots, a plurality of first stop walls respectively surrounding said terminal slots at one side, and a plurality of second stop walls respectively surrounding said terminal slots at an opposite side corresponding to said first stop walls, said first stop walls being relatively taller than said second stop walls;
   a plurality of first terminals respectively mounted in said terminal slots and partially extending out of a top side of said electrically insulative housing; and
   a plurality of second terminals respectively mounted in said terminal slots;
   wherein the first terminal and the second terminal in each of said terminal slots are movable relative to each other and adapted to contact each other when the first terminal receives a pressure toward the respective second terminal;
   wherein said first terminals each have an elongated press portion for pressing on said second terminals, and said second terminals each have a forked structure adapted to receive the elongated press portion of the respective first terminal.

2. The electrical connector as claimed in claim 1, wherein said second terminals are respectively partially inserted into a space above said second stop walls when moved relative to said first terminals.

3. The electrical connector as claimed in claim 1, wherein said second stop walls each have at least one stop portion adapted to limit displacement of said second terminals to a predetermined range.

4. The electrical connector as claimed in claim 1, wherein said second stop walls each have at least one sloping surface portion.

5. The electrical connector as claimed in claim 1, wherein said first stop walls each have a recessed positioning portions for the positioning of said first terminals.

6. The electrical connector as claimed in claim 1, wherein said first terminals each have a contact portion disposed at one end thereof and protruding over the respective first stop wall for the compression and contact of an external electronic device.

7. The electrical connector as claimed in claim 6, wherein the contact portion of each of said first terminals is notched, forming two contacts for the contact of an external electronic device.

8. The electrical as claimed in claim 1, wherein said first terminals each have a press portion for pressing the respective second terminal; said second terminals each have at least one spring arm adapted to bear the respective first terminal.

9. The electrical connector as claimed in claim 8, wherein the press portions of said first terminals each have a sloping surface portion; the at least one spring arm of each of said second terminals each has a sloping surface portion for bearing the sloping surface portions of the press portions of said first terminals respectively when said first terminals receiving a pressure.

10. The electrical connector as claimed in claim 1, wherein said second terminals each have a bottom side provided with a solder material.

11. The electrical connector as claimed in claim 1, further comprising a holding down cover pivotally connected to said electrically insulative housing and adapted to hold down a chip module on said first terminals, locking means adapted to lock said holding down cover, fastening means provided at the border area of said electrically insulative housing and adapted to fasten said electrically insulative housing to an external circuit board, and positioning means provided at the border area for bonding to the external circuit board to which said fastening means is fastened.

12. The electrical connector as claimed in claim 1, wherein said first terminals are respectively mounted in said terminal slots at a top side, and said second terminals are respectively mounted in said terminal slots at a bottom side.

* * * * *